(12) United States Patent
Thimmegowda et al.

(10) Patent No.: US 9,219,070 B2
(45) Date of Patent: Dec. 22, 2015

(54) 3-D MEMORY ARRAYS

(71) Applicant: Micron Technology, Inc., Boise, ID (US)

(72) Inventors: Deepak Thimmegowda, Boise, ID (US); Brian Cleereman, Boise, ID (US); Khaled Hasnat, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 13/759,627

(22) Filed: Feb. 5, 2013

(65) Prior Publication Data

US 2014/0217488 A1  Aug. 7, 2014

(51) Int. Cl.

| H01L 29/41 | (2006.01) |
|---|---|
| H01L 29/417 | (2006.01) |
| H01L 27/115 | (2006.01) |
| H01L 27/02 | (2006.01) |
| H01L 29/788 | (2006.01) |
| H01L 29/792 | (2006.01) |

(52) U.S. Cl.
CPC ...... H01L 27/11556 (2013.01); H01L 27/0207 (2013.01); H01L 27/11519 (2013.01); H01L 29/7889 (2013.01); H01L 27/11565 (2013.01); H01L 27/11582 (2013.01); H01L 29/7926 (2013.01)

(58) Field of Classification Search
CPC .................. H01L 21/28273; H01L 27/11582; H01L 27/11556
USPC .......................... 257/314, E23.151, E23.011; 365/185.17
See application file for complete search history.

(56) References Cited

U.S. PATENT DOCUMENTS

| 6,057,193 A | 5/2000 | Wang et al. |
|---|---|---|
| 6,063,666 A | 5/2000 | Chang et al. |
| 6,143,604 A | 11/2000 | Chiang et al. |
| 6,180,454 B1 | 1/2001 | Chang et al. |
| 6,274,471 B1 | 8/2001 | Huang |
| 6,353,242 B1 | 3/2002 | Watanabe et al. |

(Continued)

FOREIGN PATENT DOCUMENTS

| KR | 10-2011-0000487 | 1/2011 |
|---|---|---|
| KR | 10-2011-0120654 | 11/2011 |

(Continued)

OTHER PUBLICATIONS

U.S. Appl. No. 13/675,933, filed Nov. 13, 2012, Davis et al.

(Continued)

*Primary Examiner* — Jerome Jackson, Jr.
*Assistant Examiner* — Paul Budd
(74) *Attorney, Agent, or Firm* — Wells St. John, P.S.

(57) ABSTRACT

A 3-D memory array comprises a plurality of elevationally extending strings of memory cells. An array of select devices is elevationally over and individually coupling with individual of the strings. The select devices individually comprise a channel, gate dielectric proximate the channel, and gate material proximate the gate dielectric. The individual channels are spaced from one another. The gate material comprises a plurality of gate lines running along columns of the spaced channels elevationally over the strings. Dielectric material is laterally between immediately adjacent of the gate lines. The dielectric material and the gate lines have longitudinally non-linear edges at an interface relative one another. Additional embodiments are disclosed.

26 Claims, 6 Drawing Sheets

(56) References Cited

U.S. PATENT DOCUMENTS

| | | |
|---|---|---|
| 6,661,691 B2 | 12/2003 | Fricke et al. |
| 6,803,318 B1 | 10/2004 | Qiao et al. |
| 7,112,490 B1 | 9/2006 | Hong et al. |
| 7,122,488 B2 | 10/2006 | Joshi et al. |
| 7,196,004 B2 | 3/2007 | Lee et al. |
| 7,419,895 B2 | 9/2008 | Lindsay |
| 7,713,819 B2 | 5/2010 | Okajima |
| 7,829,935 B2 | 11/2010 | Makihara et al. |
| 7,898,856 B2 | 3/2011 | Aritome |
| 7,968,406 B2 | 6/2011 | Ramaswamy et al. |
| 8,148,216 B2 | 4/2012 | Arai et al. |
| 8,183,110 B2 | 5/2012 | Ramaswamy et al. |
| 8,187,938 B2 | 5/2012 | Lim et al. |
| 8,228,743 B2 | 7/2012 | Min et al. |
| 8,278,695 B2 | 10/2012 | Kidoh et al. |
| 8,283,205 B2 | 10/2012 | Pagaila et al. |
| 8,288,811 B2 | 10/2012 | Ramaswamy et al. |
| 8,437,192 B2 | 5/2013 | Lung et al. |
| 8,507,976 B2 | 8/2013 | Joo |
| 8,969,153 B2 | 3/2015 | Lee et al. |
| 2003/0201500 A1 | 10/2003 | Furukawa et al. |
| 2005/0200026 A1 | 9/2005 | Liaw |
| 2007/0004140 A1 | 1/2007 | Jang et al. |
| 2007/0004141 A1 | 1/2007 | Kim et al. |
| 2007/0048989 A1 | 3/2007 | Ahn et al. |
| 2008/0009113 A1 | 1/2008 | Shimizu |
| 2008/0179659 A1 | 7/2008 | Enda et al. |
| 2009/0117725 A1 | 5/2009 | Sun |
| 2009/0230454 A1 | 9/2009 | Pekny |
| 2009/0289297 A1 | 11/2009 | Kim et al. |
| 2009/0296476 A1 | 12/2009 | Shin et al. |
| 2009/0310425 A1 | 12/2009 | Sim et al. |
| 2010/0155813 A1 | 6/2010 | Murata et al. |
| 2010/0171162 A1* | 7/2010 | Katsumata et al. ............ 257/314 |
| 2010/0208503 A1 | 8/2010 | Kuo |
| 2010/0258852 A1 | 10/2010 | Lim et al. |
| 2010/0276743 A1 | 11/2010 | Kuniya et al. |
| 2011/0019486 A1* | 1/2011 | Jang et al. ................ 365/185.25 |
| 2011/0031550 A1 | 2/2011 | Komori et al. |
| 2011/0147823 A1 | 6/2011 | Kuk et al. |
| 2011/0177661 A1 | 7/2011 | Song et al. |
| 2011/0180865 A1 | 7/2011 | Ramaswamy |
| 2011/0193153 A1 | 8/2011 | Higuchi et al. |
| 2011/0241098 A1 | 10/2011 | Park et al. |
| 2011/0291172 A1* | 12/2011 | Hwang et al. ................. 257/314 |
| 2011/0316064 A1 | 12/2011 | Kim et al. |
| 2012/0001249 A1 | 1/2012 | Alsmeier et al. |
| 2012/0012921 A1 | 1/2012 | Liu |
| 2012/0068247 A1 | 3/2012 | Lee et al. |
| 2012/0086072 A1 | 4/2012 | Yun et al. |
| 2012/0098050 A1* | 4/2012 | Shim et al. .................... 257/324 |
| 2012/0119285 A1 | 5/2012 | Yang |
| 2012/0135583 A1* | 5/2012 | Jang et al. ..................... 438/433 |
| 2012/0175697 A1 | 7/2012 | Hall et al. |
| 2012/0184078 A1 | 7/2012 | Kiyotoshi |
| 2012/0193596 A1 | 8/2012 | Nakazawa |
| 2012/0205722 A1* | 8/2012 | Lee et al. ...................... 257/211 |
| 2012/0211822 A1 | 8/2012 | Lim et al. |
| 2012/0211823 A1 | 8/2012 | Lim et al. |
| 2012/0220088 A1 | 8/2012 | Alsmeier |
| 2012/0231593 A1 | 9/2012 | Joo et al. |
| 2012/0241842 A1 | 9/2012 | Matsuda |
| 2012/0329224 A1 | 12/2012 | Kong et al. |
| 2013/0087843 A1 | 4/2013 | Han |
| 2014/0008714 A1 | 1/2014 | Makala et al. |
| 2014/0162418 A1 | 6/2014 | Keshav et al. |

FOREIGN PATENT DOCUMENTS

| | | |
|---|---|---|
| KR | 10-2012-0113596 | 10/2012 |
| WO | PCT/US2013/063302 | 1/2014 |
| WO | PCT/US2014/011228 | 4/2014 |
| WO | PCT/US2014/011228 | 8/2015 |

OTHER PUBLICATIONS

U.S. Appl. No. 13/708,789, filed Dec. 7, 2012, Keshav et al.
U.S. Appl. No. 13/735,908, filed Jan. 7, 2013, Hopkins.
U.S. Appl. No. 13/738,147, filed Jan. 10, 2013, Thimmegowda et al.
U.S. Appl. No. 13/894,481, filed May 15, 2013, Ramaswamy.
U.S. Appl. No. 13/894,631, filed May 15, 2013, Ramaswamy.
Electrical properties of crystalline YSZ films on silicon as alternative gate dielectrics Semicond. Sci. Technol. 16 (2001) L13-L16.

* cited by examiner

3-D MEMORY ARRAYS

TECHNICAL FIELD

Embodiments disclosed herein pertain to 3-D memory arrays.

BACKGROUND

Memory provides data storage for electronic systems. Flash memory is one type of memory, and has numerous uses in modern computers and devices. For instance, personal computers may have BIOS stored on a flash memory chip. As another example, it is becoming increasingly common for computers and other devices to use flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Flash memory cell strings have historically been arranged to extend horizontally, although vertically extending memory cell strings are now being considered. One goal in fabrication of vertical memory cell strings is to reduce the horizontal area of the substrate occupied by the memory cells as compared to horizontally extending memory cell strings, albeit typically at the expense of increased vertical thickness. Nevertheless, vertically orienting memory cell strings can create horizontal packing density considerations not present in horizontally oriented memory cell string layouts.

DETAILED DESCRIPTION OF EXAMPLE EMBODIMENTS

Figure 1:
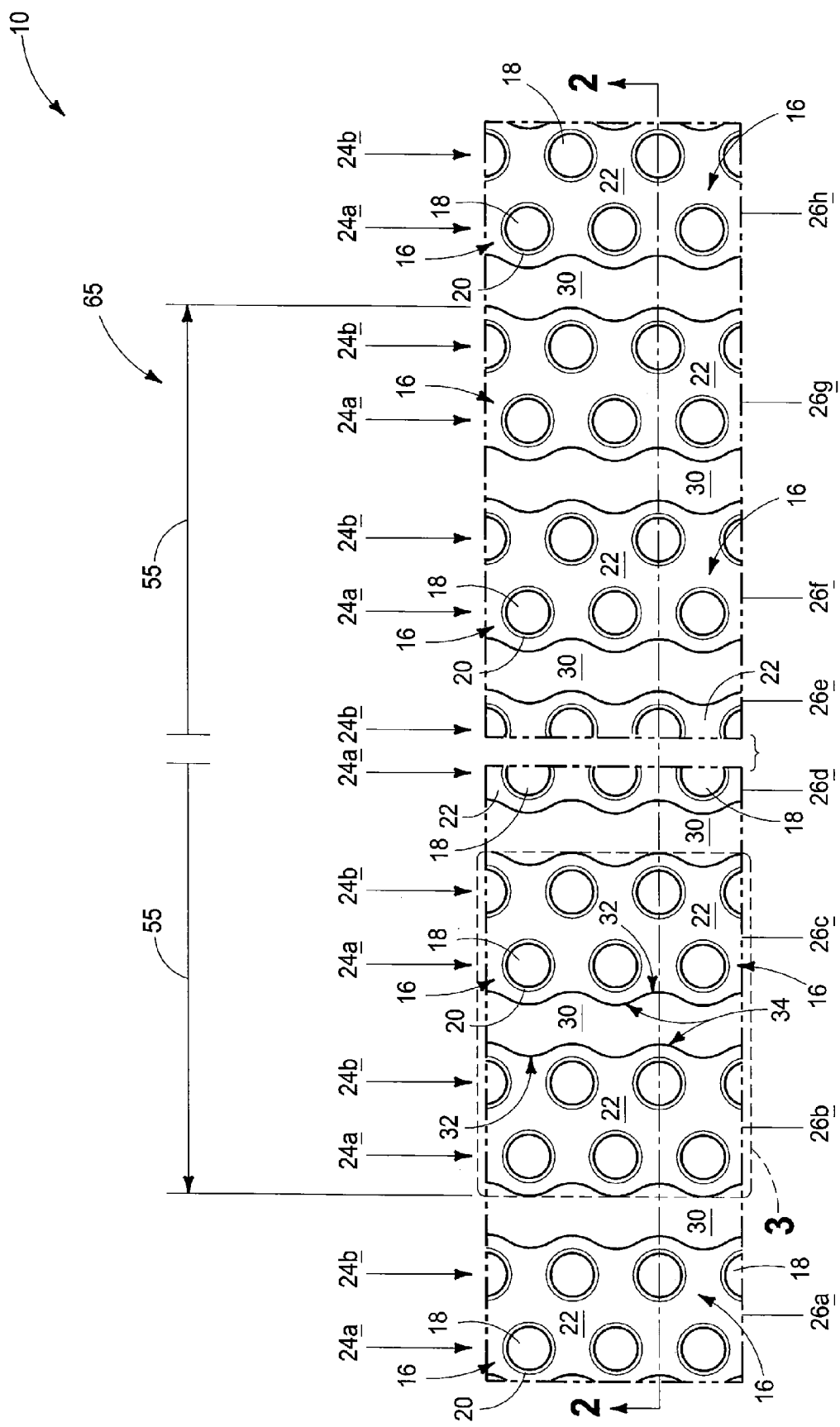
FIG. 1 is a diagrammatic top-down sectional view of a memory array in accordance with an embodiment of the invention, and is taken through line 1-1 in FIG. 2.
Figure 2:
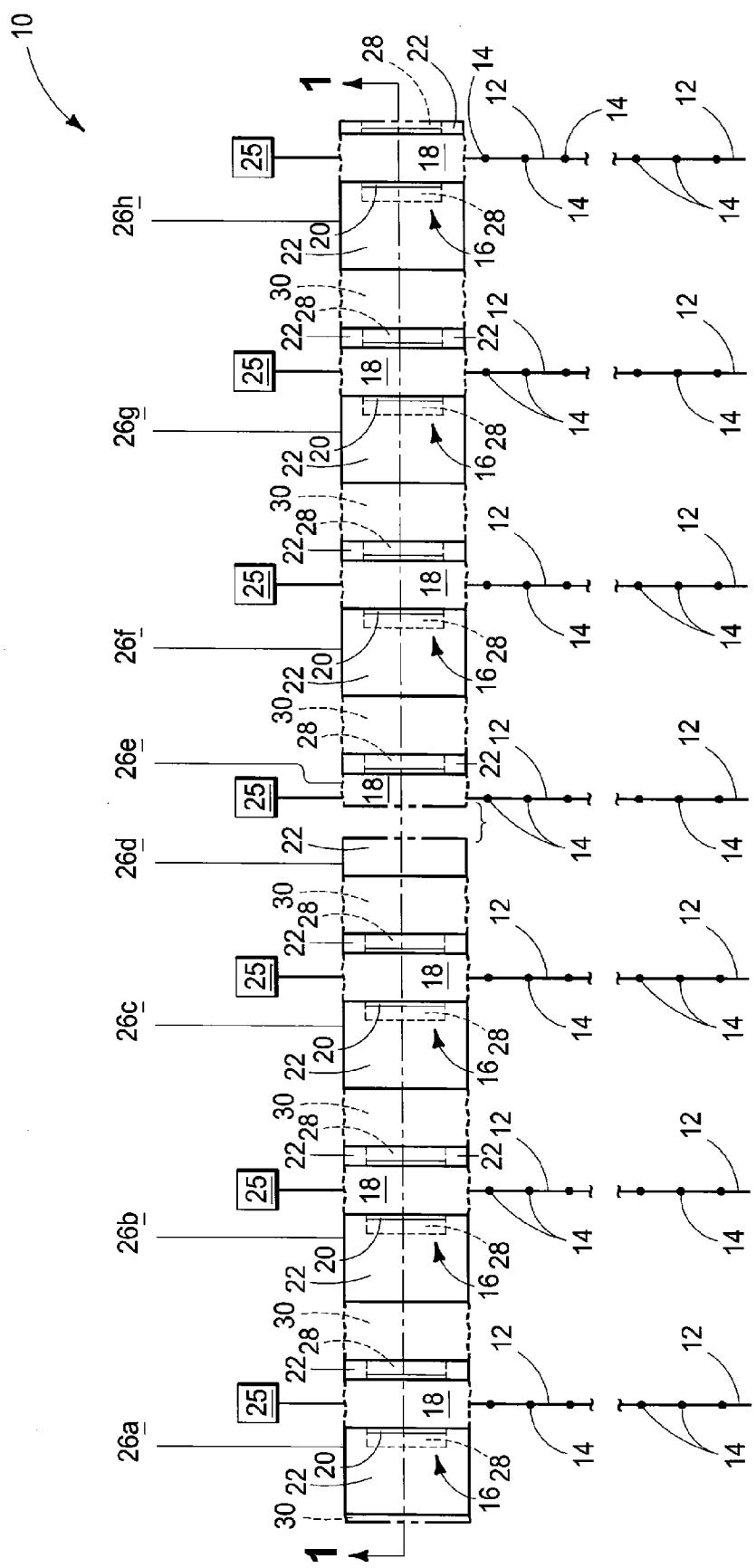
FIG. 2 is a hybrid structural-schematic of the FIG. 1 memory array, and is taken through line 2-2 in FIG. 1.

A 3-D memory array in accordance with some embodiments of the invention is described with reference to FIGS. 1-3. As used in this document, a "sub-array" may also be considered as an array. FIG. 1 is a diagrammatic top-down sectional view of a memory array 10 taken through line 1-1 in FIG. 2, with FIG. 2 being a hybrid structural-schematic taken through line 2-2 in FIG. 1. Three dimensional memory array 10 comprises a plurality of elevationally extending strings of memory cells. In this document, "elevationally extending" refers to a direction that is angled away by at least 45° from a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Individual strings are indicated schematically in FIG. 2 by vertical lines 12 and memory cells are indicated schematically by dots 14. Any existing or yet-to-be-developed memory cell structure may be used, with one example being referred to in more detail below. Regardless, memory cells 14 may be serially coupled relative to one another within individual strings 12 as shown in FIG. 2, or may be otherwise arranged within individual strings 12.

An array of select devices 16 is elevationally over strings 12, with select devices 16 individually coupling (i.e., electrically) with individual strings 12. Select devices 16 may connect with conductive contacts 25 (shown schematically) to connect the select devices to other circuitry (not shown). The select devices may comprise transistors, for example as shown. Example select devices 16 are shown as individually comprising a channel 18, gate dielectric 20, and gate material 22 that is proximate gate dielectric 20. Any of the materials and/or structures described herein may be homogenous or non-homogenous. Further, each may be formed using any suitable existing or yet-to-be developed technique (with or without plasma), with atomic layer deposition, chemical vapor deposition, physical vapor deposition, epitaxial growth, diffusion doping, and ion implanting being examples. Example channel and gate materials include semiconductive material (e.g., polysilicon) doped with appropriate and different concentration dopants, with doped semiconductive material above and below channels 18 functioning as source/drains of the select device transistor in one embodiment. An example gate dielectric is silicon dioxide and/or silicon nitride. Channels 18 are shown as being circular in cross-section, although other shapes may be used.

In some embodiments, the individual channels are spaced from one another along columns, and the gate material is arrayed in a plurality of gate lines running along those columns. One or more than one column of channels may be in individual of the gate lines. For example, FIGS. 1 and 2 show a portion of memory array 10 which comprises gate lines 26 (shown as 26a-26h), with each gate line including multiple (two as shown) columns 24a, 24b of channels 18 that are individually elevationally over individual strings 12. Channels 18 may be extensions of channel material of memory cells 14 within individual strings 12. In the depicted embodiment, the individual gate lines comprise multiple columns of spaced channels 18 which are individually surrounded by material 22 of an individual gate line 26a-h. The gate portion of an individual transistor select device 16 may be considered as some functional minimum-dimensioned annulus 28 (FIGS. 2 and 3) for activating current flow for each respective select device. Gate material 22 outside of such annuluses may be considered as conductive interconnecting material that electrically connects adjacent of the individual gate annuluses along a respective gate line 26 a-h. Annuluses 28 may be effectively spaced from one another (as shown) or may overlap (not shown).

Dielectric material 30 is laterally between immediately adjacent gate lines 26, with doped and/or undoped silicon dioxide being examples. Dielectric material 30 has a longitudinally non-linear edge 32 and gate line 26 has a longitudinally non-linear edge 34 (FIGS. 1 and 3) at an interface of dielectric material 30 and gate lines 26 relative one another. In other words, dielectric material 30 and gate lines 26 have longitudinal edges that are non-linear where such interface. In one ideal embodiment and as shown, longitudinal edges 32/34 are curvilinear. By way of alternate examples, edges 32 and 34 might include a combination of straight segments which longitudinally angle relative one another (not shown) or include a combination of curved and straight segments (not shown).

In one embodiment, the channels in immediately adjacent of the columns between the immediately adjacent gate lines are longitudinally staggered relative one another, and in one embodiment are equidistantly so staggered, for example as shown. Specifically, channel column 24b in gate line 26b and channel column 24a in gate line 26c are immediately adjacent relative one another. Further, channels 18 in columns 26b and 26c across dielectric material 30 are longitudinally staggered relative one another, and equidistantly in the FIGS. 1-3 embodiment. In one embodiment, the channels of all immediately adjacent columns are longitudinally staggered relative to one another. For example in the FIGS. 1-3 embodiment, channel columns 24a, 24b within individual gate lines 26a-h are longitudinally staggered as are the columns between immediately adjacent gate lines.

Embodiments of the invention may enable space/width between immediately adjacent gate lines to be reduced, even if not reducing width of dielectric material 30, thereby resulting in reduced block height in a memory array comprising elevationally extending strings of memory cells. For example, FIG. 1 shows a block height dimension 55 of a memory block (which can be a sub-block) 65 that is defined by a collection of the memory cell strings that is within the expanse defined by dimension 55, and which may be reduced in comparison to dielectric and gate materials having a linear (i.e., longitudinally straight) interface.

In one embodiment, the select devices across the dielectric material have pitch equal to channel width plus twice gate dielectric width plus gate material width between the gate dielectric and the dielectric material plus dielectric material width. For example, FIG. 3 shows such an example pitch $P_2$ as being equal to channel width 40 (e.g., twice channel radius) plus twice gate dielectric width 41 plus gate material width 42 between gate dielectric 20 and dielectric material 30 plus dielectric material width 43. In the depicted embodiment, such may occur where an outermost lateral edge of gate dielectric 20 is linearly coincident with a laterally innermost location of the interface of dielectric material 30 and gate material 22 (e.g., as shown by line 55 in FIG. 3). Alternate constructions may be used which result in such a pitch, or other pitches may be used. Regardless, in one embodiment, gate material width 42 is no greater than the functional minimum-dimension of annulus 28, in one embodiment is equal to such dimension (as shown), and in one embodiment is less than such dimension (not shown). Regardless, dielectric material width 43 may or may not be constant along the longitudinal direction, with width 43 being constant in the depicted embodiment.

In one embodiment, for example where the channels of the columns with respect to the immediately adjacent of the gate lines are longitudinally equidistantly staggered relative one another, the select devices across the dielectric material have pitch $P_2$ as follows:

$$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the individual channel columns of the individual gate lines. For example referring to FIG. 3, an example such pitch $P_2$ is shown with respect to center-to-center distance C between diagonally adjacent channels 18 in immediately adjacent gate lines 26b, 26c, where "A" is center-to-center distance between longitudinally adjacent channels 18 in the channel column 24a of gate line 26c.

Figure 3:
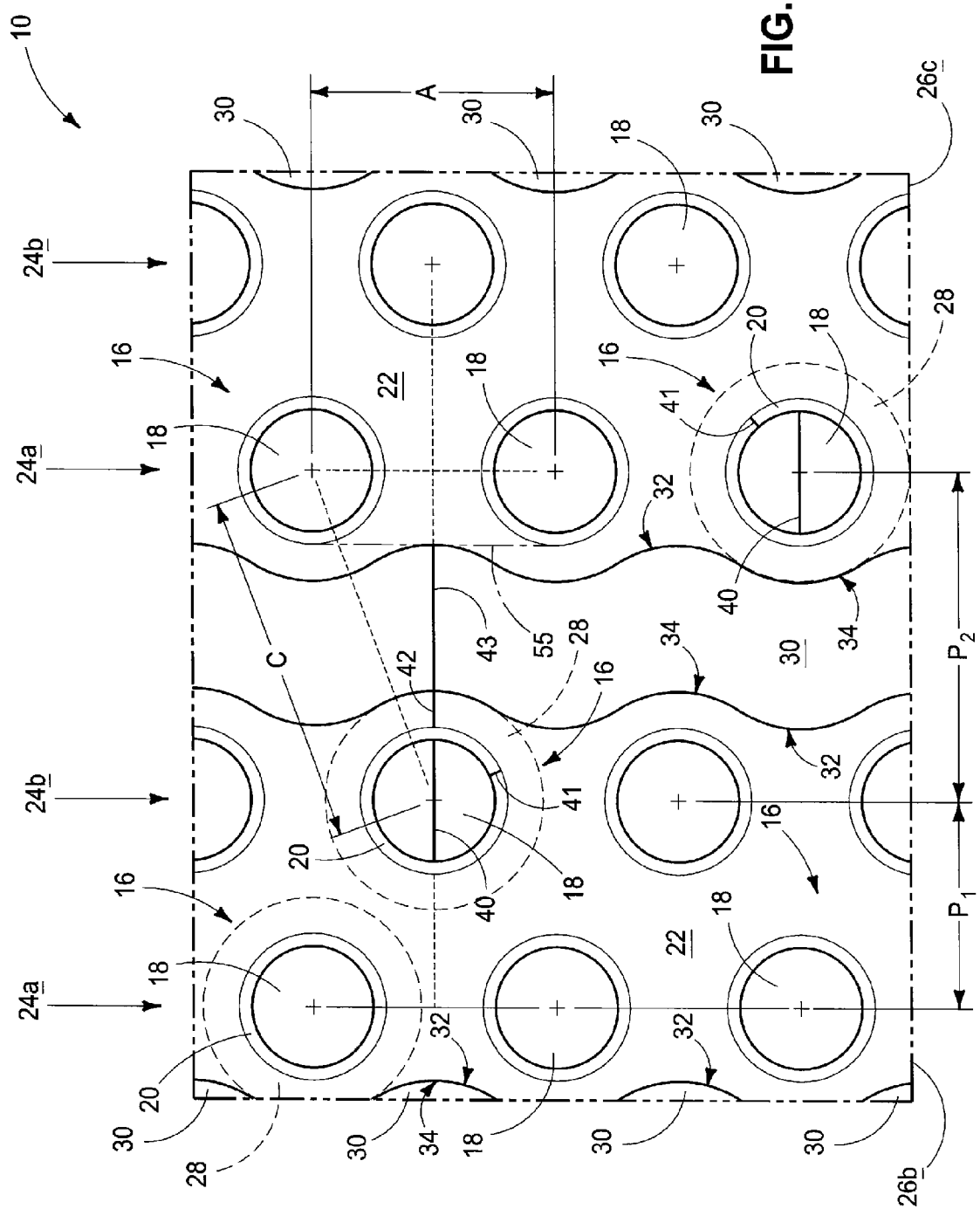
FIG. 3 is an enlargement of area 3 in FIG. 1.
Figure 4:
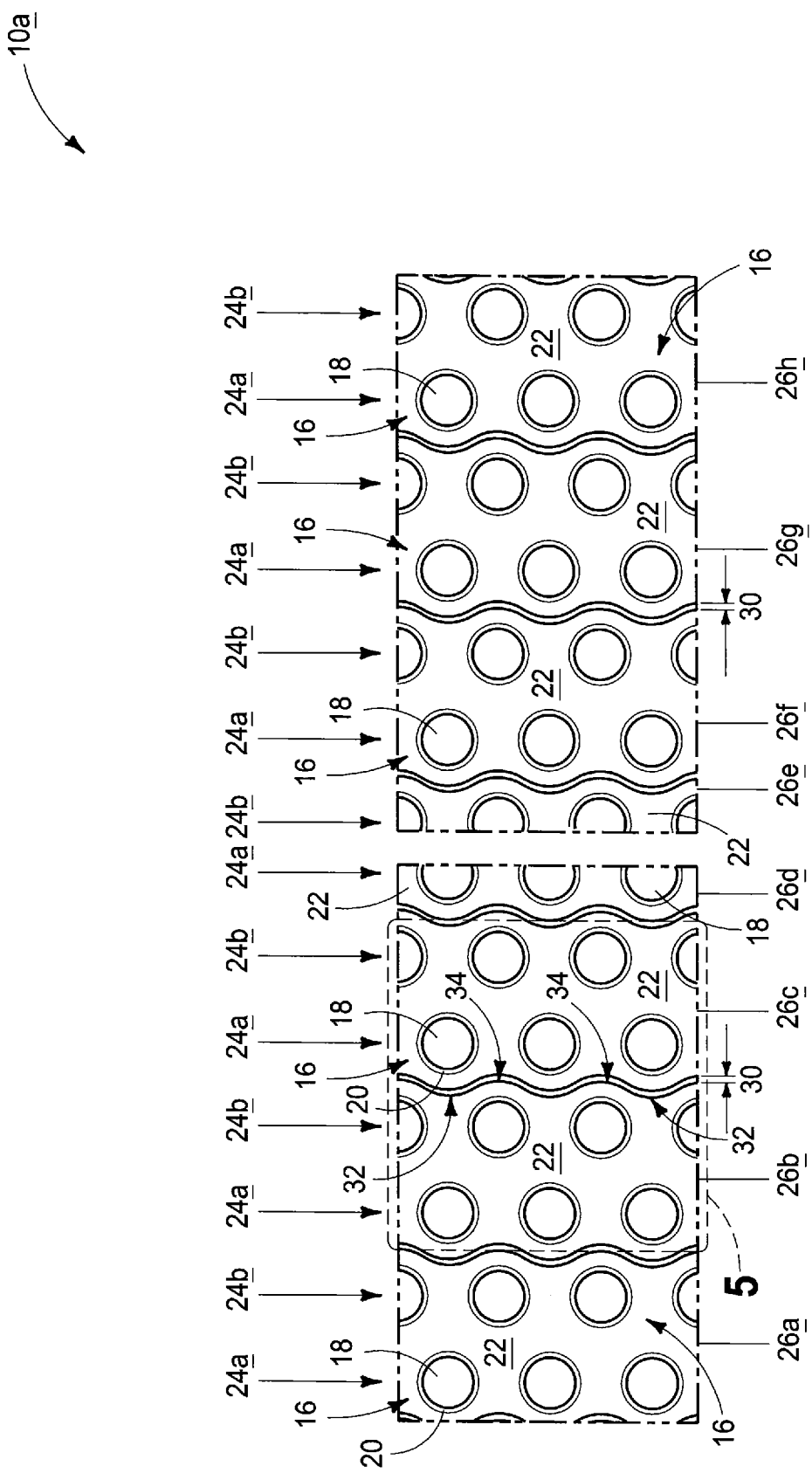
FIG. 4 is a diagrammatic top-down sectional view of an alternate embodiment memory array to that shown in FIG. 1 and in accordance with an embodiment of the invention.
Figure 5:
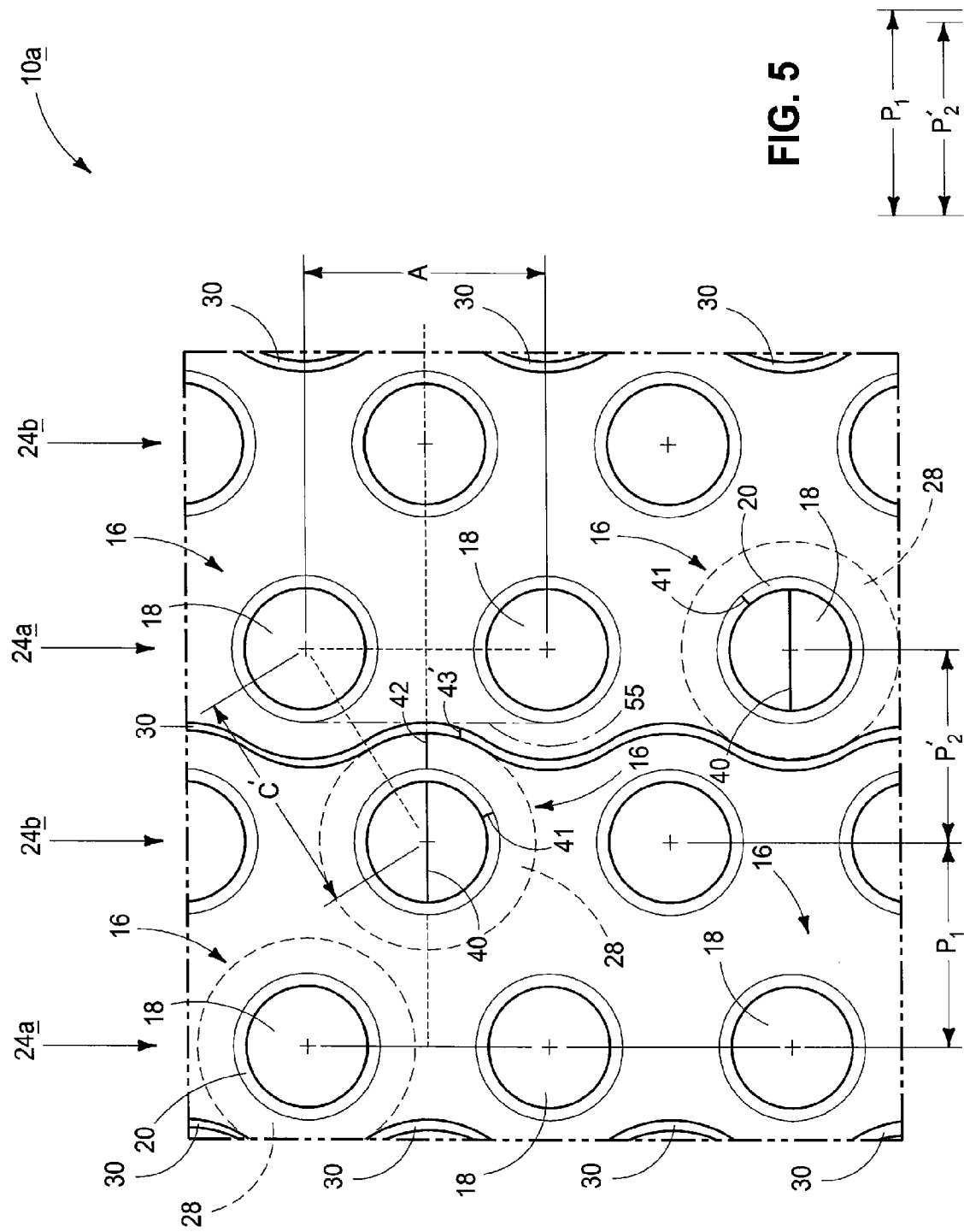
FIG. 5 is an enlargement of area 5 in FIG. 4.

FIGS. 1-3 show an embodiment where pitch of the select devices across immediately adjacent of the gate lines is greater than pitch of the select devices within individual of the gate lines (e.g., $P_2$ is greater than $P_1$). Alternately, this relationship could be reversed or these values could be equal. FIGS. 4 and 5 by way of example show an alternate embodiment memory array 10a wherein pitch of the select devices across immediately adjacent of the gate lines ($P_2'$) is less than pitch of the select devices within individual of the gate lines ($P_1$). Such may occur by reducing gate dielectric width 43' in comparison to width 43 of the FIGS. 1-3 embodiment.

Figure 6:
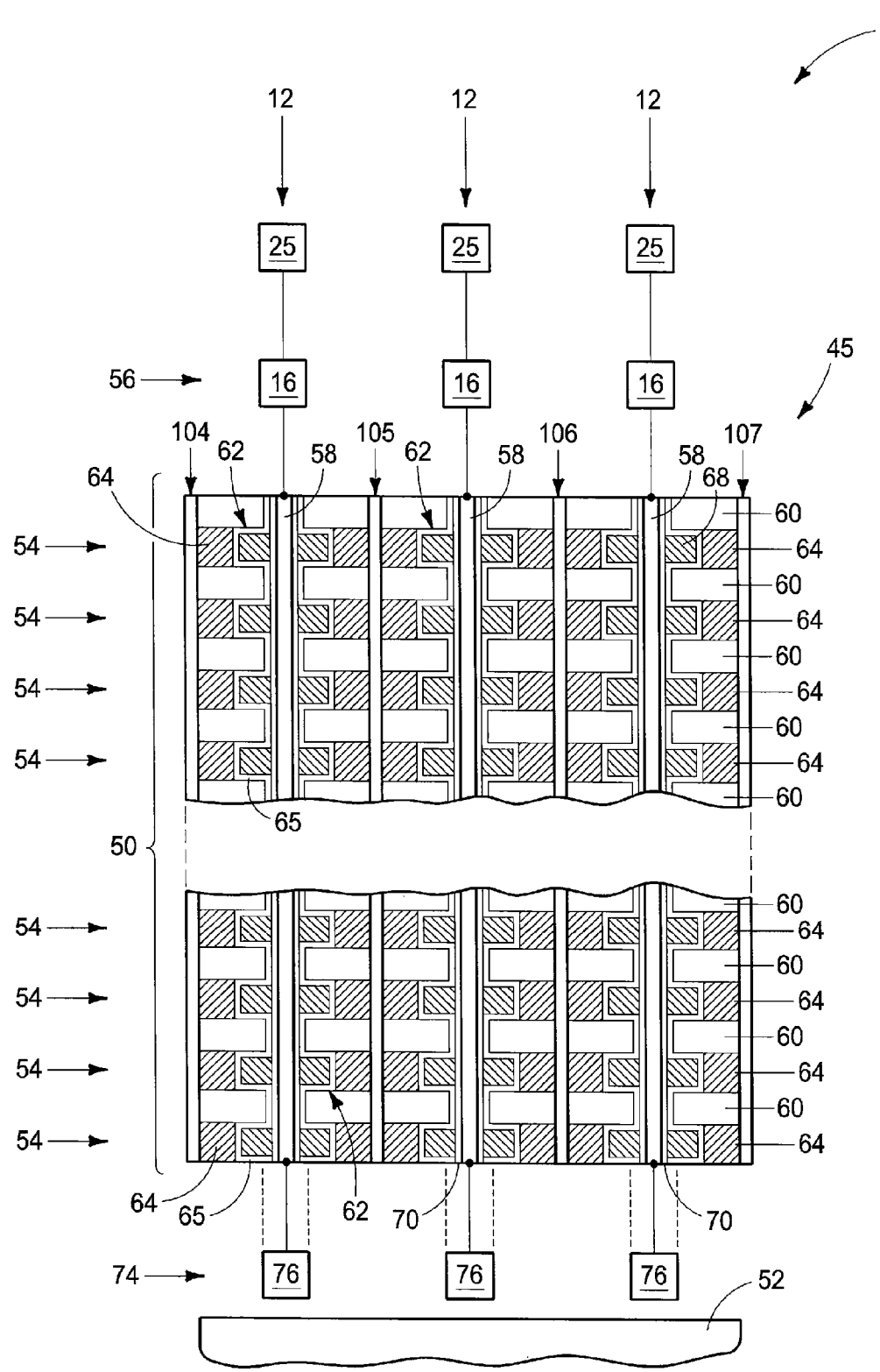
FIG. 6 is a hybrid structural-schematic of a memory array in accordance with an embodiment of the invention.

In some embodiments, the memory cell strings comprise serially-coupled memory cells comprising an active area pillar (e.g., channel material) extending through elevationally inner tiers. The inner tiers individually comprise charge storage structures adjacent the pillars and access lines adjacent the charge storage structures. An example such embodiment is described with reference to FIG. 6, and which may be incorporated in any of the above-described embodiments. Like numerals from the above embodiment have been used where appropriate. FIG. 6 shows an example construction 45 which includes a stack 50 supported by a base 52. Base 52 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Stack 50 comprises tiers 54 which are elevationally inward of an outer tier 56 within which select devices 16 (shown schematically) are formed. Elevationally extending memory cell strings 12 individually comprise an active area pillar 58 extending through elevationally inner tiers 54, and in one embodiment extend vertically. Pillars 58 may extend into select devices 16 (e.g., forming at least part of channels 18) within outer tier 56. Pillars 58 may be circular or of other shapes in cross-section. Intervening dielectric material 60 is between tiers 54. Inner tiers 54 individually comprise charge storage structures 62 adjacent pillars 58 and access lines 64 adjacent charge storage structures 62. Access lines 64 may comprise any suitable conductive material, such as metal, elemental metals, alloys of elemental metals, metal compounds and/or conductively doped semiconductive material. Dielectric material 65 is between access lines 64 and charge storage structures 62, with a silicon dioxide and silicon nitride composite being an example material. Example charge storage structures 62 are shown as comprising charge storage material 68 separated from active area pillars 58 by dielectric material 70 (e.g., silicon dioxide and/or silicon nitride). Example suitable charge storage material includes floating gate material (e.g., doped or undoped silicon) and charge-trapping material (e.g., silicon nitride, nanodots, etc.).

Select devices 16 within outer tier 56 may comprise one or a combination of select gate drains (SGD's) and select gate sources (SGS's). For example, in one embodiment select devices 16 may all be SGD's and in one embodiment an array of SGS's 76 may be provided in a tier 74 elevationally inward of tiers 54 and which individually couple with individual memory cell strings 12. As alternate examples, select devices 16 may all be SGS's, or may be a combination of SGD's and SGS's for example with respect to pipe-shaped bit cost scalable (P-BiCS) NAND flash (not shown). Conductive contacts or other circuitry 25 may be in the form of bit lines running orthogonal to the plane of the page on which FIG. 6 lies, for example coupling with an elevationally outer source/drain region (not shown) of individual select devices 16 that are in different columns.

An embodiment of the invention encompasses a 3-D memory array which comprises a plurality of elevationally extending strings of memory cells. Such also includes an array of select devices that are elevationally over and individually coupled with individual of the strings. The select devices comprise nested longitudinally curvilinear gate lines laterally separated by dielectric material. The example embodiments described above and shown in FIGS. 1 and 4 are but two example such 3-D memory arrays. Any other attributes as described above may be used.

Conclusion

In some embodiments, a 3-D memory array comprises a plurality of elevationally extending strings of memory cells. An array of select devices is elevationally over and individually coupling with individual of the strings. The select devices individually comprise a channel, gate dielectric proximate the channel, and gate material proximate the gate dielectric. The individual channels are spaced from one another. The gate material comprises a plurality of gate lines running along columns of the spaced channels elevationally over the strings. Dielectric material is laterally between immediately adjacent of the gate lines. The dielectric material and the gate lines have longitudinally non-linear edges at an interface relative one another.

In some embodiments, a 3-D memory array comprises a plurality of elevationally extending strings of memory cells. An array of select devices is elevationally over and individually couple with individual of the strings. The select devices comprise nested longitudinally curvilinear gate lines laterally separated by dielectric material.

In some embodiments, a 3-D memory array comprises a plurality of elevationally extending strings of memory cells. An array of select devices is elevationally over and individually couple with individual of the strings. The select devices comprise gate lines laterally separated by dielectric material. The select devices across the dielectric material have pitch equal to select device channel width plus twice gate dielectric width plus gate line material width between the gate dielectric and the dielectric material plus dielectric material width.

In some embodiments, a 3-D memory array comprises a plurality of elevationally extending strings of memory cells. An array of select devices is elevationally over and individually couple with individual of the strings. The select devices comprise gate lines laterally separated by dielectric material. The select devices comprise a column of spaced channels within individual of the gate lines. The channels in the columns with respect to immediately adjacent of the gate lines are longitudinally equidistantly staggered relative one another. The select devices across the dielectric material have pitch $P_2$ equal to $$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the column of channels in the individual gate lines.

In some embodiments, a 3-D memory array comprises a plurality of elevationally extending strings of memory cells. An array of select devices is elevationally over and individually couple with individual of the strings. The select devices comprise gate lines laterally separated by dielectric material. Individual of the gate lines comprise multiple columns of spaced select device channels individually surrounded by material of the individual gate line. Pitch of the select devices across immediately adjacent of the gate lines is less than pitch of the select devices within individual of the gate lines.

In some embodiments, a 3-D memory array comprises a plurality of serially-coupled and elevationally extending strings of memory cells. The strings individually comprise an active area pillar extending through elevationally inner tiers. The inner tiers individually comprise charge storage structures adjacent the pillars and access lines adjacent the charge storage structures. An elevationally outer tier comprises an array of select gate drains (SGD's) that individually couple with the individual strings. The SGD's individually comprise a channel pillar elevationally over and coupled with one of the active area pillars. Gate dielectric surrounds the channel pillar, and gate material surrounds the gate dielectric. The gate material comprises a plurality of SGD gate lines in the outer tier running along columns of the channel pillars. The channel pillars in immediately adjacent of the columns between the immediately adjacent gate lines are longitudinally equidistantly staggered relative one another. Dielectric material is in the outer tier and laterally separates immediately adjacent of the gate lines. The dielectric material and the gate lines have longitudinally curvilinear edges at an interface relative one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A 3-D memory array, comprising:
  a plurality of elevationally extending strings of memory cells;
  an array of select devices elevationally over and individually coupling with individual of the strings; the select devices individually comprising a channel, gate dielectric proximate the channel, and gate material proximate the gate dielectric; the individual channels being spaced from one another; the gate material comprising a plurality of gate lines running along columns of the spaced channels elevationally over the strings;
  dielectric material laterally between immediately adjacent of the gate lines, the dielectric material and the gate lines having longitudinally non-linear edges at an interface relative one another; and the channels in immediately adjacent of the columns between the immediately adjacent gate lines being longitudinally staggered laterally across the dielectric material relative one another.

2. The 3-D memory array of claim 1 wherein the dielectric material and the gate lines having longitudinally curvilinear edges at the interface.

3. The 3-D memory array of claim 1 wherein the channels of the immediately adjacent columns between the immediately adjacent gate lines are longitudinally equidistantly staggered laterally across the dielectric material relative one another.

4. The 3-D memory array of claim 1 wherein the select devices across the dielectric material have pitch equal to channel width plus twice gate dielectric width plus gate material width between the gate dielectric and the dielectric material plus dielectric material width.

5. A 3-D memory array, comprising:
a plurality of elevationally extending strings of memory cells;
an array of select devices elevationally over and individually coupling with individual of the strings; the select devices individually comprising a channel, gate dielectric proximate the channel, and gate material proximate the gate dielectric; the individual channels being spaced from one another; the gate material comprising a plurality of gate lines running along columns of the spaced channels elevationally over the strings;
dielectric material laterally between immediately adjacent of the gate lines, the dielectric material and the gate lines having longitudinally non-linear edges at an interface relative one another; and
multiple columns of spaced channels in individual of the gate lines.

6. The 3-D memory array of claim 5 wherein the spaced channels are individually surrounded by material of the individual gate line; and
pitch of the select devices across immediately adjacent of the gate lines is less than pitch of the select devices within individual of the gate lines.

7. The 3-D memory array of claim 5 wherein the spaced channels are individually surrounded by material of the individual gate line; and
pitch of the select devices across immediately adjacent of the gate lines is greater than pitch of the select devices within individual of the gate lines.

8. A 3-D memory array, comprising:
a plurality of elevationally extending strings of memory cells;
an array of select devices elevationally over and individually coupling with individual of the strings; the select devices individually comprising a channel, gate dielectric proximate the channel, and gate material proximate the gate dielectric; the individual channels being spaced from one another; the gate material comprising a plurality of gate lines running along columns of the spaced channels elevationally over the strings;
dielectric material laterally between immediately adjacent of the gate lines, the dielectric material and the gate lines having longitudinally non-linear edges at an interface relative one another; and
the memory cells being serially coupled within the individual strings, the strings individually comprising an active area pillar extending through elevationally inner tiers, the inner tiers individually comprising charge storage structures adjacent the pillars and access lines adjacent the charge storage structures, the select devices comprising select gate drains (SGD's).

9. A 3-D memory array, comprising:
a plurality of elevationally extending strings of memory cells;
an array of select devices elevationally over and individually coupling with individual of the strings; the select devices individually comprising a channel, gate dielectric proximate the channel, and gate material proximate the gate dielectric; the individual channels being spaced from one another; the gate material comprising a plurality of gate lines running along columns of the spaced channels elevationally over the strings;
dielectric material laterally between immediately adjacent of the gate lines, the dielectric material and the gate lines having longitudinally non-linear edges at an interface relative one another;
the channels in the columns with respect to immediately adjacent of the gate lines being longitudinally equidistantly staggered relative one another; and
the select devices across the dielectric material having pitch $P_2$ equal to $$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the column of channels in the individual gate lines.

10. A 3-D memory array, comprising:
a plurality of elevationally extending strings of memory cells;
an array of select devices elevationally over and individually coupling with individual of the strings, the select devices comprising adjacent longitudinally curvilinear gate lines laterally separated by dielectric material; and
the memory cells being serially coupled within the individual strings, the strings individually comprising an active area pillar extending through elevationally inner tiers, the inner tiers individually comprising charge storage structures adjacent the pillars and access lines adjacent the charge storage structures.

11. The 3-D memory array of claim 10 wherein the select devices comprise channels that are individually spaced from one another along a column in individual of the gate lines, the channels of immediately adjacent of the columns between immediately adjacent of the gate lines being longitudinally staggered relative one another.

12. The 3-D memory array of claim 10 wherein the select devices comprise select gate drains (SGD's).

13. A 3-D memory array, comprising:
a plurality of elevationally extending strings of memory cells;
an array of select devices elevationally over and individually coupling with individual of the strings, the select devices comprising gate lines laterally separated by dielectric material;
the select devices across the dielectric material have pitch equal to select device channel width plus twice gate dielectric width plus gate line material width between the gate dielectric and the dielectric material plus dielectric material width; and individual of the gate lines comprising multiple columns of spaced select device channels individually surrounded by material of the individual gate line; and pitch of the select devices across immediately adjacent of the gate lines being less than pitch of the select devices within individual of the gate lines.

14. The 3-D memory array of claim 13 wherein the channels in the columns with respect to immediately adjacent of the gate lines are longitudinally equidistantly staggered relative one another; and the select devices across the dielectric material have pitch $P_2$ equal to $$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the column of channels in the individual gate lines.

15. A 3-D memory array, comprising:
a plurality of elevationally extending strings of memory cells;
an array of select devices elevationally over and individually coupling with individual of the strings, the select devices comprising gate lines laterally separated by dielectric material;
the select devices across the dielectric material have pitch equal to select device channel width plus twice gate dielectric width plus gate line material width between the gate dielectric and the dielectric material plus dielectric material width; and
the memory cells being serially coupled within the individual strings, the strings individually comprising an active area pillar extending through elevationally inner tiers, the inner tiers individually comprising charge storage structures adjacent the pillars and access lines adjacent the charge storage structures, the select devices comprising select gate drains (SGD's).

16. A 3-D memory array, comprising:
a plurality of elevationally extending strings of memory cells;
an array of select devices elevationally over and individually coupling with individual of the strings, the select devices comprising gate lines laterally separated by dielectric material, the select devices comprising a column of spaced channels within individual of the gate lines, the channels in the columns with respect to immediately adjacent of the gate lines being longitudinally equidistantly staggered relative one another;
the select devices across the dielectric material have pitch $P_2$ equal to $$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the column of channels in the individual gate lines;

individual of the lines comprising multiple columns of spaced channels individually surrounded by material of the individual gate line; and pitch of the select devices across immediately adjacent of the gate lines being less than pitch of the select devices within individual of the gate lines.

17. A 3-D memory array, comprising:
a plurality of elevationally extending strings of memory cells;
an array of select devices elevationally over and individually coupling with individual of the strings, the select devices comprising gate lines laterally separated by dielectric material, the select devices comprising a column of spaced channels within individual of the gate lines, the channels in the columns with respect to immediately adjacent of the gate lines being longitudinally equidistantly staggered relative one another;
the select devices across the dielectric material have pitch $P_2$ equal to $$P_2 = \sqrt{C^2 - \left(\frac{A}{2}\right)^2}$$

where "C" is center-to-center distance between diagonally adjacent channels in the immediately adjacent gate lines, and "A" is center-to-center distance between longitudinally adjacent channels in the column of channels in the individual gate lines;
the memory cells being serially coupled within the individual strings, the strings individually comprising an active area pillar extending through elevationally inner tiers, the inner tiers individually comprising charge storage structures adjacent the pillars and access lines adjacent the charge storage structures, the select devices comprising select gate drains (SGD's).

18. A 3-D memory array, comprising:
a plurality of elevationally extending strings of memory cells;
an array of select devices elevationally over and individually coupling with individual of the strings, the select devices comprising gate lines laterally separated by dielectric material, individual of the gate lines comprising multiple columns of spaced select device channels individually surrounded by material of the individual gate line; and
pitch of the select devices across immediately adjacent of the gate lines being less than pitch of the select devices within individual of the gate lines.

19. The 3-D memory array of claim 18 wherein the memory cells are serially coupled within the individual strings, the strings individually comprising an active area pillar extending through elevationally inner tiers, the inner tiers individually comprising charge storage structures adjacent the pillars and access lines adjacent the charge storage structures, the select devices comprising select gate drains (SGD's).

20. A 3-D memory array, comprising:
a plurality of serially-coupled and elevationally extending strings of memory cells, the strings individually comprising an active area pillar extending through elevationally inner tiers, the inner tiers individually comprising charge storage structures adjacent the pillars and access lines adjacent the charge storage structures;
an elevationally outer tier comprising an array of select gate drains (SGD's) that individually couple with the individual strings; the SGD's individually comprising a channel pillar elevationally over and coupled with one of the active area pillars, gate dielectric surrounding the channel pillar, and gate material surrounding the gate dielectric; the gate material comprising a plurality of SGD gate lines in the outer tier running along columns of the channel pillars; the channel pillars in immediately adjacent of the columns between the immediately adjacent gate lines being longitudinally equidistantly staggered relative one another; and dielectric material in the outer tier laterally separating immediately adjacent of the gate lines, the dielectric material and the gate lines having longitudinally curvilinear edges at an interface relative one another.

21. The 3-D memory array of claim 20 comprising a tier elevationally inward of the inner tiers, the inward tier comprising an array of select gate sources (SGS's) that individually couple with the individual strings.

22. The 3-D memory array of claim 20 wherein the channel pillars of all immediately adjacent of the columns are longitudinally staggered relative one another.

23. The 3-D memory array of claim 20 wherein the SGD's across the dielectric material have pitch equal to channel pillar width plus twice gate dielectric width plus gate material width between the gate dielectric and the dielectric material plus dielectric material width.

24. The 3-D memory array of claim 20 wherein the SGD's across the dielectric material have pitch $P_2$ equal to $$P_2 = \sqrt{C^2 - \left(\frac{A}{2}\right)^2}$$

where "C" is center-to-center distance between diagonally adjacent channel pillars in the immediately adjacent gate lines, and "A" is center-to-center distance between longitudinally adjacent channel pillars in the column of channel pillars in the individual gate lines.

25. The 3-D memory array of claim 20 wherein individual of the gate lines comprise multiple columns of spaced select device channel pillars individually surrounded by material of the individual gate line; and pitch of the SGD's across immediately adjacent of the gate lines is less than pitch of the SGD's within the individual gate lines.

26. The 3-D memory array of claim 20 wherein individual of the gate lines comprise multiple columns of spaced channels individually surrounded by material of the individual gate line; and pitch of the select devices across immediately adjacent of the gate lines is greater than pitch of the select devices within individual of the gate lines.

* * * * *